United States Patent [19]

Shiozaki et al.

[11] Patent Number: 4,682,204
[45] Date of Patent: Jul. 21, 1987

[54] FUSE ELEMENT FOR INTEGRATED CIRCUIT MEMORY DEVICE

[75] Inventors: Masakazu Shiozaki, Yokohama; Hidetaro Nishimura, Kawasaki, both of Japan

[73] Assignee: Tokyo Shibaura Denki Kabushiki Kaisha, Japan

[21] Appl. No.: 807,128

[22] Filed: Dec. 11, 1985

Related U.S. Application Data

[63] Continuation of Ser. No. 467,296, Feb. 17, 1983, abandoned.

[30] Foreign Application Priority Data

Mar. 9, 1982 [JP] Japan .................................. 57-35800

[51] Int. Cl.$^4$ ...................... H01L 27/02; H01L 29/06; H01L 23/48
[52] U.S. Cl. ........................................ 357/51; 357/55; 357/59; 357/65; 357/68
[58] Field of Search ........................ 357/51, 55, 59, 65, 357/68; 365/96

[56] References Cited

U.S. PATENT DOCUMENTS

| | | | |
|---|---|---|---|
| 3,564,354 | 2/1971 | Aoki et al. | 29/576 R |
| 3,767,981 | 10/1973 | Polata | 357/53 |
| 3,792,319 | 2/1974 | Tsang | 357/59 |
| 4,023,197 | 5/1977 | Nagdo et al. | 357/68 |
| 4,151,546 | 4/1979 | Kawagai et al. | 357/65 |
| 4,209,894 | 7/1980 | Keen | 29/577 R |
| 4,267,633 | 5/1981 | Seiler | 357/51 |

FOREIGN PATENT DOCUMENTS

| | | | |
|---|---|---|---|
| 53-66380 | 6/1978 | Japan | 357/65 |
| 57-24565 | 2/1982 | Japan | 357/55 |

OTHER PUBLICATIONS

Rand, "Reliability of LSI Memory Circuits Exposed to Laser Cutting"; Electro Scientific Industries, Inc., Technical Article TA-34; Apr. 1979.

Primary Examiner—J. Carroll
Attorney, Agent, or Firm—Finnegan, Henderson, Farabow, Garrett & Dunner

[57] ABSTRACT

A fuse element prepared from, for example, polycrystalline silicon is deposited on an insulating layer provided on the main surface of a semiconductor substrate in which an IC memory is formed. Connecting portions are integrally formed at both ends of the melting away portion of the fuse element. Each of the connecting portions has a stepped surface having stepped sections. The stepped surface is tightly contacted with a stepped surface having stepped sections formed on the insulating layer.

3 Claims, 10 Drawing Figures

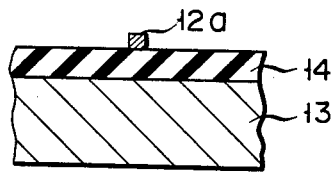
FIG. 3A
PRIOR ART
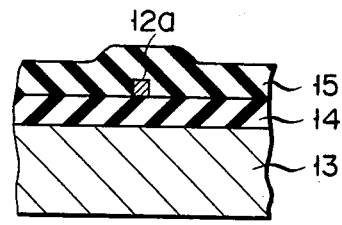
FIG. 3B
PRIOR ART
FIG. 4A
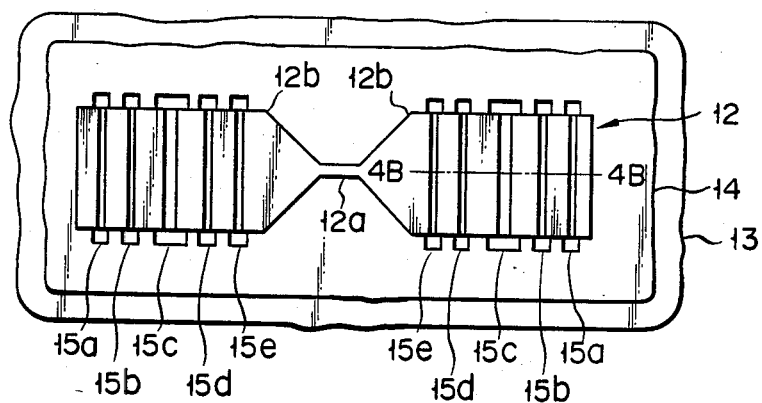
FIG. 4B
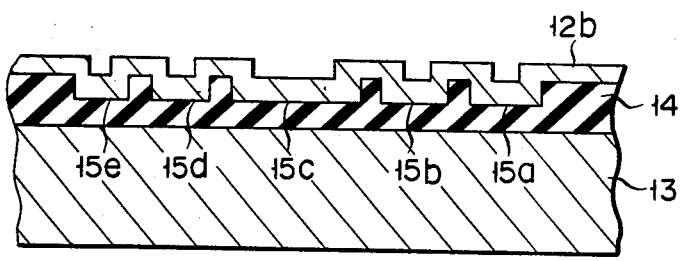

FUSE ELEMENT FOR INTEGRATED CIRCUIT MEMORY DEVICE

This application is a continuation of application Ser. No. 467,296 filed Feb. 17, 1983 abandoned.

BACKGROUND OF THE INVENTION

This invention relates to a fuse element used with an integrated memory device, and more particularly to the construction of connecting portions integrally formed at both ends of a melting away portion of the fuse element.

A process which is generally known is shown in FIG. 1 and comprises the step of inserting fuse elements between the row and column lines of a read only memory (ROM) at their junctions through a gate-emitter pass of a transistor, and, when the ROM is programmed, cutting a prescribed fuse by means of, for example, a laser beam. FIG. 1 typically indicates a transistor TRn·m whose base electrode is connected to a row line Yn, whose collector is connected to a power source Vcc, and whose emitter is connected to a column line Xm through a fuse element F1, and a transistor TR(n+1)m whose base electrode is connected to a row line Yn+1, whose collector is connected to the power source Vcc and whose emitter is connected to a column line Xm through a fuse element F2. FIG. 1 illustrates the case where the fuse element F2 is thermally broken off. Transistors TRn(m+1), TR(n+1)(m+1), and fuse elements F3, F4 are connected to the row and column lines in the same manner as described above.

It is also known that a random access memory (RAM) is provided with a redundancy circuit comprising a spare row or column section, and when any row or column section of the RAM fails, the defective row or column section is replaced by the corresponding spare row or column section through the fuse element. The fuse element is generally prepared from, for example, aluminium, nichrome or polycrystalline silicon. This kind of fuse element has hitherto been made in the form shown in FIG. 2A or 2B, namely, comprising a melting away portion 12a which is expected in case it needs to be thermally broken off, and connecting portions 12b integrally formed at both ends of the melting away portion 12a. Both connecting portions 12a, 12b are integrally prepared from, for example, a polycrystalline layer. FIGS. 3A and 3B indicate the position of the fuse element comprising the aforesaid melting away portion 12a and connecting portions 12b (not shown) relative to a semiconductor substrate 13 and an insulation layer 14. A semiconductor device or the integrated memory (not shown) is mounted on that portion of the semiconductor substrate 13 which is not indicated in FIGS. 3A and 3B. The insulation layer 14 prepared from, for example, SiO$_2$ is deposited on one surface of the semiconductor substrate. FIG. 3A is a sectional view of a semiconductor device indicating a melting away portion 12a of the fuse element mounted on the insulation layer 14. FIG. 3B is a sectional view of a semiconductor device having an insulating protective layer 15 enclosing the melting away portion 12a of the fuse element of FIG. 3A.

Description will now be given of the drawbacks encountered in the conventional fuse element of FIGS. 2A and 2B which were prepared from, for example, polycrystalline silicon. SiO$_2$ has a thermal diffusion coefficient of $8.4 \times 10^{-3}$ cm$^2$/s, while a fuse element prepared from polycrystalline silicon has prominently large thermal diffusion coefficient of 0.5 cm$^2$/s. A wire prepared from, for example, polycrystalline silicon is fitted to the connecting portions 12b of the fuse element, and further to a semiconductor device or the integrated memory (not shown) formed on the semiconductor substrate 13. When the melting away portion 12a of the fuse element is thermally broken off, heat energy is easily conducted to the semiconductor element of the semiconductor device through the connecting portions 12b and polycrystalline silicon wire. Consequently, the semiconductor element is readily damaged by the heat energy received. The above-mentioned drawbacks may be summarized as follows: (1) The heat energy produced in the melting away portion 12a of the fuse element sometimes dissolves a wire connected to the connecting portions 12b or an aluminium electrode of a semiconductor element connected to the wire; (2). When the connecting portions 12b of the fuse element are fitted to a highly resistive polycrystalline silicon layer which is not doped with any impurity, then an external impurity is likely to be diffused in said highly resistive layer, thereby causing the resistivity of the highly resistive layer to be reduced to an undesirable low level; (3). A leak current tends to flow, due to the conduction of heat energy, through a PN junction of a semiconductor element formed on the semiconductor substrate 13 in the proximity of the fuse element; and (4). Heat energy released from the melting away portion 12a of the fuse element causes, for example, Na$^+$ ions included in the surface of the insulating layer 14 to be readily diffused, causing the electric properties of the semiconductor element to be easily changed due to the diffusion of the Na$^+$ ions. The conventional process of suppressing the drawbacks described in the above-noted items (1) to (4) comprises means for extending a distance between the fuse element and semiconductor element as much as possible, and means for enlarging the area of the connecting portions 12b of the fuse element to increase the heat capacity thereof, thereby preventing heat from being released from the connecting portions 12b. When raising the integration circuits density of integrated particularly large scale integrated circuit, the two above-mentioned means obviously prove unsatisfactory. Consequently, it has been strongly desired to develop means which can reduce an area occupied by a fuse element and eliminate the drawbacks of the conventional fuse element described in the items (1) to (4).

SUMMARY OF THE INVENTION

It is accordingly the object of this invention to provide a fuse element for use with an integrated memory, which occupies a small area relative to a semiconductor substrate and is without the drawbacks encountered in the conventional fuse element.

A fuse element according to this invention is formed on an insulation layer mounted on a semiconductor substrate having an integrated memory formed thereon, prepared from a material to be thermally broken off in case of need, and comprises a melting away portion; connecting portions which are integrally formed at both ends of the melting away portion with a greater width than that of the melting away portion for connecting the melting away portion to the integrated memory; each of the connecting portions being provided with a stepped surface having stepped sections tightly contacting a stepped section formed on the insulation layer.

BRIEF DESCRIPTION OF THE DRAWINGS

FIGS. 3A and 3B respectively indicate fractional sectional views of a semiconductor device comprising the conventional fuse element of FIG. 2A or 2B;

FIG. 4A is a plan view of a fuse element according to a first embodiment of this invention;

FIG. 4B is an enlarged sectional view on line 4B—4B of FIG. 4A;

DETAILED DESCRIPTION OF THE PREFERRED EMBODIMENTS

Figure 1:
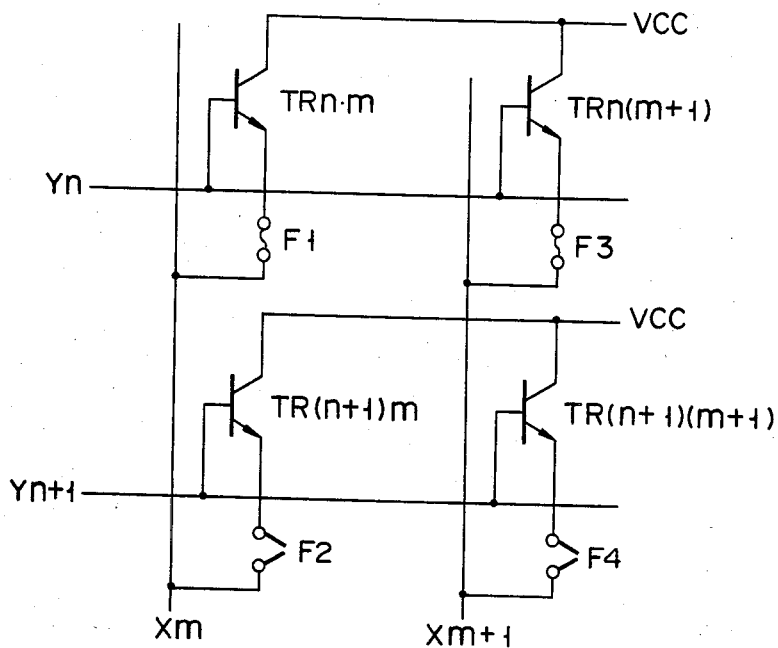
FIG. 1 is a schematic circuit diagram of a ROM including fuse elements.
Figure 2A:
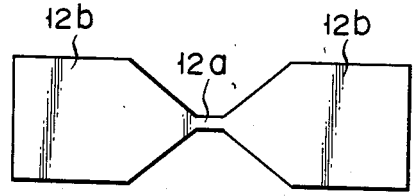
FIGS. 2A and 2B are plan views of the conventional fuse elements which were used in the ROM in FIG. 1.
Figure 2B:
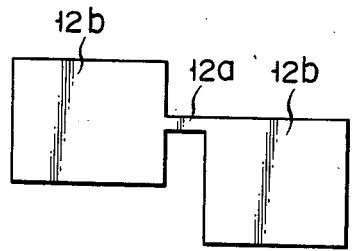

Referring to FIGS. 4A and 4B, an insulation layer 14 of $SiO_2$ is deposited with a thickness of, for example, 1 micron (10,000Å) on the surface of a semiconductor substrate 13 on which, for example, an integrated memory is formed. Grooves 15a to 15e are selectively provided by photoetching with a depth of 5,000Å in those portions of the insulation layer 14 on which the connecting portions 12b of the fuse element 12 are formed. A polycrystalline silicon layer is deposited with a thickness of 5,000Å on the insulating layer 14 including the grooves 15a to 15e. The polycrystalline silicon layer is patterned to provide a fuse element 12. A polycrystalline silicon wire (not shown) is generally fitted to the connecting portions 12b of the fuse element 12. The polycrystalline silicon layer used as a fuse element is tightly deposited with a uniform thickness of 5,000Å on the surface of the insulating layer including the aforesaid grooves 15a to 15e. As a result, the surface of each connecting portion 12b of the fuse element 12 is provided with a stepped surface having stepped sections as shown in FIG. 4B, thereby obviously causing the effective length on line 4B—4B of the connecting portions 12b to be more extended than in the case where the surface of the connecting portion 12b lacks such stepped sections, increasing the heat capacity of said connection portions 12b, and reducing an area occupied by the fuse element 12. The above-mentioned features of the fuse element of this invention have the advantages that the integration density of an integrated circuit or a large scale integrated circuit to be formed on the semiconductor substrate 13 can be improved and the previously described drawbacks of items (1) to (4) accompanying the conventional fuse element can be eliminated.

Figure 5:
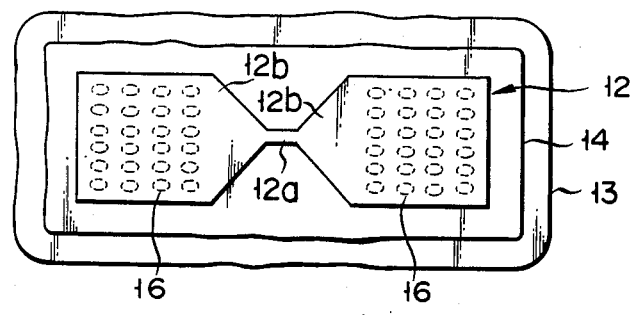
FIG. 5 is a plan view of a fuse element according to a second embodiment of the invention.
Figure 6:
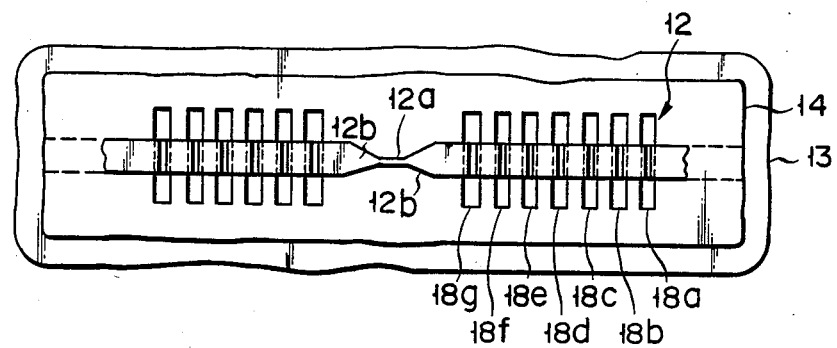
FIG. 6 is a plan view of the fuse element according to a third embodiment of the invention.
Figure 7:
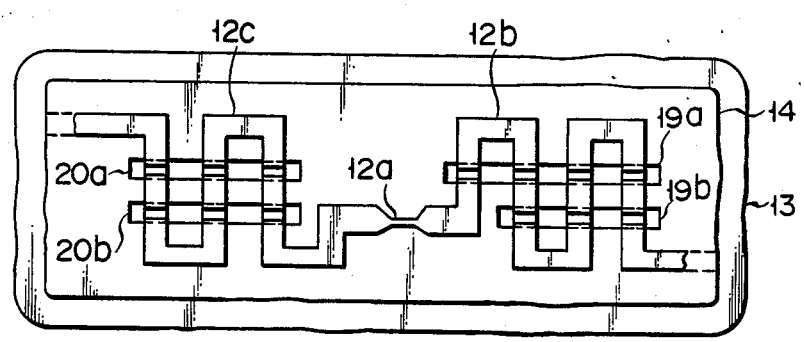
FIG. 7 is a plan view of a fuse element according to a fourth embodiment of the invention.

With a fuse element of FIG. 5 according to a second embodiment of this invention, the grooves 15a to 15e of FIG. 4A are replaced by elliptic recesses 16. With a fuse element of FIG. 6 according to a third embodiment of the invention, the grooves 15a to 15e of FIG. 4A are replaced by shorter grooves 18a to 18g, and the connecting portions 12b of the fuse element 12 are narrower and more extended than in FIG. 4A. With a fuse element of FIG. 7 according to a fourth embodiment of the invention, the right connecting portion 12b has a different shape from the left connecting portion 12c. Grooves 19a, 19b are formed in the right connecting portion 12b.

Grooves 20a, 20b are formed in the left connecting portion 12c. It will be noted that the shapes of the connecting portions and grooves need not be restricted to those indicated but may be properly changed to meet the occasion. The fuse element neet not be exclusively formed of the polycrystalline silicon. It may be formed of aluminium, for example.

What we claim is:

1. A fuse element for use within an integrated memory which is formed on an insulation layer mounted on a semiconductor substrate having said integrated memory formed thereon and prepared from a prescribed material to be thermally broken off in case of need, comprising:

a melting away portion;

connecting portions which are integrally formed at both ends of said melting away portions with a greater width than that of said melting away portion for connecting said melting away portion to said integrated memory;

each of said connecting portions being provided with a plurality of paired step sections for increasing the heat capacity of said connecting portions, said plurality of paired stepped sections tightly contacting the surface of corresponding paired step sections formed on said insulating layer, each said paired step section of said connecting portion including a first step which steps down from a first level to a second level and a second step which steps up from said second level to a third level coplanar with the said first level.

2. The fuse element according to claim 1, wherein said prescribed material of said fuse element is polycrystalline silicon.

3. The fuse element according to claim 1, wherein said prescribed material of said fuse element is aluminum.

* * * * *